United States Patent
Sung et al.

(10) Patent No.: US 10,707,328 B2
(45) Date of Patent: Jul. 7, 2020

(54) METHOD OF FORMING EPITAXIAL FIN STRUCTURES OF FINFET

(71) Applicant: Taiwan Semiconductor Manufacturing Co., Ltd., Hsinchu (TW)

(72) Inventors: Hsueh-Chang Sung, Zhubei (TW); Kun-Mu Li, Zhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/581,778

(22) Filed: Apr. 28, 2017

(65) Prior Publication Data

US 2018/0151698 A1   May 31, 2018

Related U.S. Application Data

(60) Provisional application No. 62/428,220, filed on Nov. 30, 2016.

(51) Int. Cl.
*H01L 29/66* (2006.01)
*H01L 21/308* (2006.01)
*H01L 21/02* (2006.01)
*H01L 29/78* (2006.01)
*H01L 21/3065* (2006.01)
(Continued)

(52) U.S. Cl.
CPC .... *H01L 29/66636* (2013.01); *H01L 21/0262* (2013.01); *H01L 21/02532* (2013.01); *H01L 21/02576* (2013.01); *H01L 21/02579* (2013.01); *H01L 21/02609* (2013.01); *H01L 21/3065* (2013.01); *H01L 21/3085* (2013.01); *H01L 29/045* (2013.01); *H01L 29/0847* (2013.01); *H01L 29/66545* (2013.01); *H01L 29/66795* (2013.01); *H01L 29/785* (2013.01);
(Continued)

(58) Field of Classification Search
CPC ............ H01L 21/02609; H01L 29/045; H01L 29/66795; H01L 29/7851; H01L 29/66636; H01L 29/785; H01L 27/0886; H01L 21/823431; H01L 29/7848; H01L 29/41791; H01L 21/3065; H01L 21/823821; H01L 27/0924
See application file for complete search history.

(56) References Cited

U.S. PATENT DOCUMENTS 8,610,241 B1 * 12/2013 Hu ................. H01L 27/0629
257/353
8,703,556 B2 * 4/2014 Kelly ............... H01L 29/785
438/157
(Continued)

*Primary Examiner* — Khiem D Nguyen
(74) *Attorney, Agent, or Firm* — Sterne, Kessler, Goldstein & Fox P.L.L.C.

(57) ABSTRACT

A method of forming a semiconductor device having first and second fin structures on a substrate includes forming a first epitaxial region of the first fin structure and forming a second epitaxial region of the second fin structure. The method further includes forming a buffer region on the first epitaxial region of the first fin structure and performing an etch process to etch back a portion of the second epitaxial region. The buffer region helps to prevents etch back of a top surface of the first epitaxial region during the etch process. Further, a capping region is formed on the buffer region and the etched second epitaxial region.

20 Claims, 7 Drawing Sheets

(51) Int. Cl.
*H01L 29/04* (2006.01)
*H01L 29/08* (2006.01)
*H01L 29/06* (2006.01)

(52) U.S. Cl.
CPC ...... *H01L 29/7848* (2013.01); *H01L 29/7851* (2013.01); *H01L 29/0653* (2013.01)

(56) References Cited

U.S. PATENT DOCUMENTS

| | | | |
|---|---|---|---|
| 8,796,666 B1* | 8/2014 | Huang | H01L 29/66795 257/18 |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,312,274 B1* | 4/2016 | Bryant | H01L 27/1211 |
| 9,520,482 B1 | 12/2016 | Chang et al. | |
| 9,548,303 B2 | 1/2017 | Lee et al. | |
| 9,576,814 B2 | 2/2017 | Wu et al. | |
| 2011/0298058 A1* | 12/2011 | Kawasaki | H01L 29/66795 257/401 |
| 2013/0187228 A1* | 7/2013 | Xie | H01L 29/785 257/347 |
| 2013/0295738 A1* | 11/2013 | Kuo | H01L 29/66795 438/283 |
| 2014/0065782 A1* | 3/2014 | Lu | H01L 29/785 438/294 |
| 2014/0077296 A1* | 3/2014 | Yamashita | H01L 21/823431 257/347 |
| 2014/0273365 A1* | 9/2014 | Wei | H01L 21/823821 438/199 |
| 2014/0299934 A1* | 10/2014 | Kim | H01L 29/7848 257/347 |
| 2015/0035023 A1* | 2/2015 | Kim | H01L 29/785 257/288 |
| 2015/0041855 A1* | 2/2015 | Liao | H01L 29/41791 257/192 |
| 2015/0061024 A1* | 3/2015 | Li | H01L 27/088 257/368 |
| 2015/0099336 A1* | 4/2015 | Wong | H01L 21/823418 438/229 |
| 2015/0303118 A1* | 10/2015 | Wang | H01L 21/823481 257/401 |
| 2017/0076973 A1* | 3/2017 | Lee | H01L 21/764 |

* cited by examiner

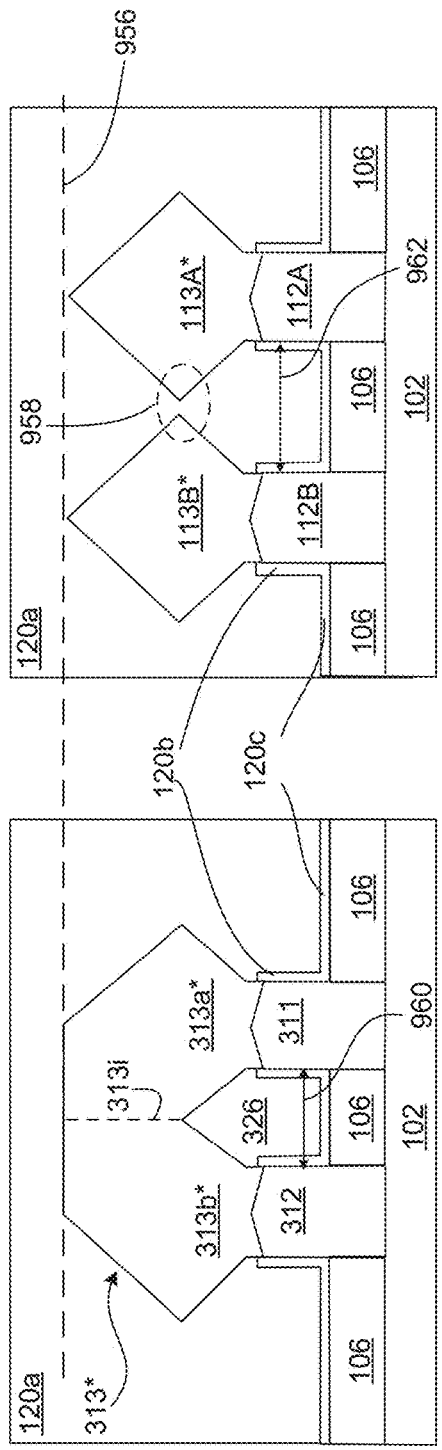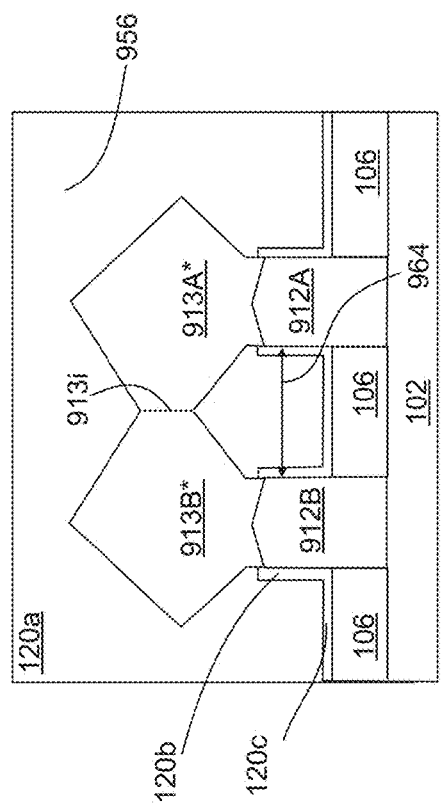
FIG. 9A
FIG. 9B
FIG. 9C

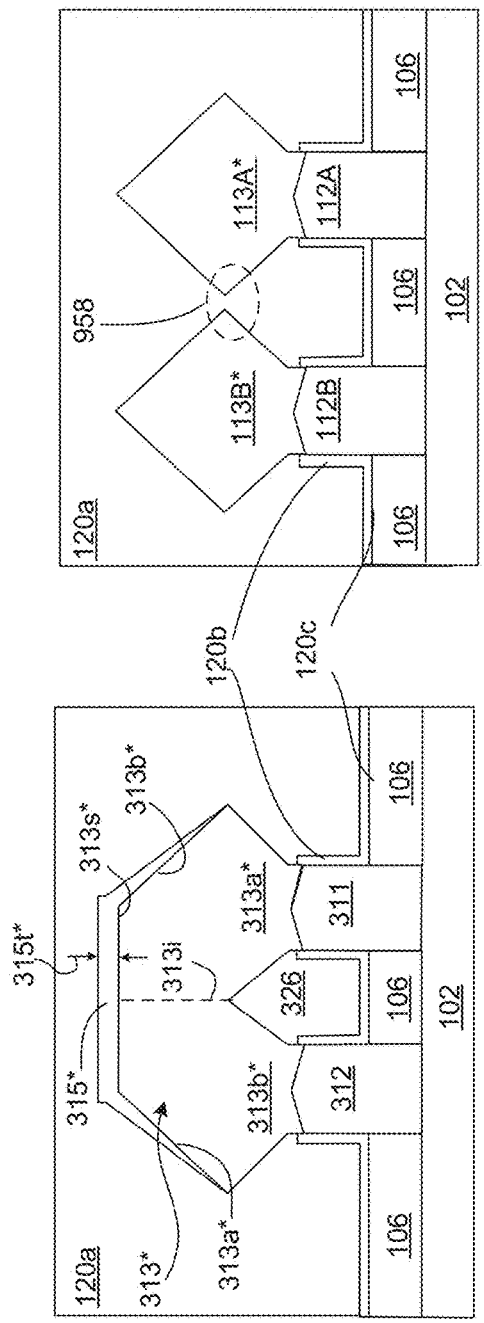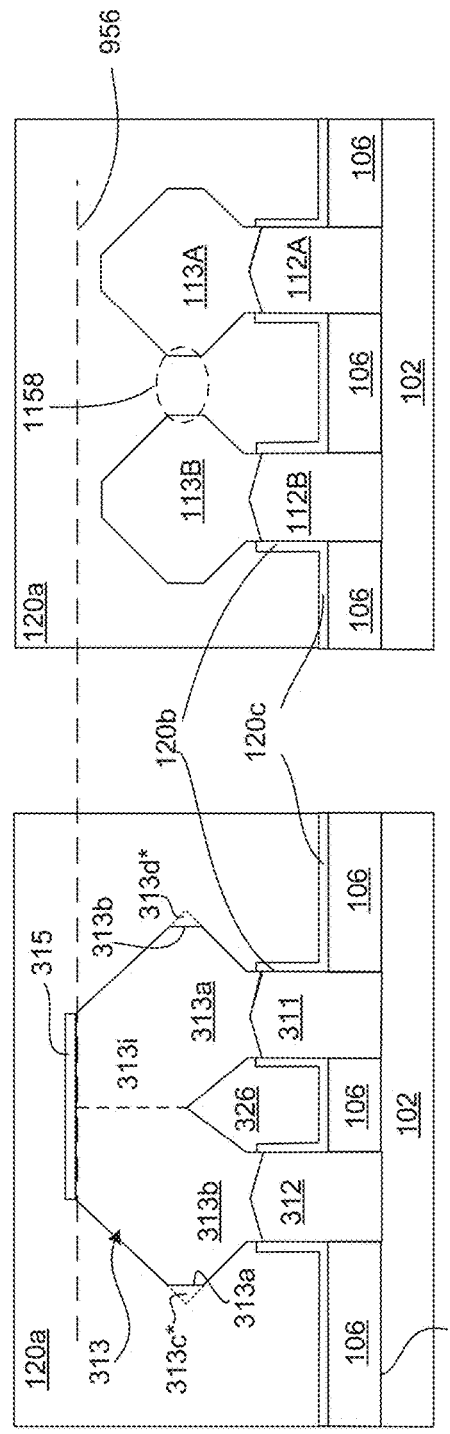

METHOD OF FORMING EPITAXIAL FIN STRUCTURES OF FINFET

BACKGROUND

This disclosure generally relates to semiconductor devices and methods of fabricating the same.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and finFETs.

Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 9A-12A and 9B-12B are cross-sectional views of finFETs at various stages of their exemplary fabrication process.

Illustrative embodiments will now be described with reference to the accompanying drawings. In the drawings, like reference numerals generally indicate identical, functionally similar, and/or structurally similar elements.

DETAILED DESCRIPTION

Figure 2:
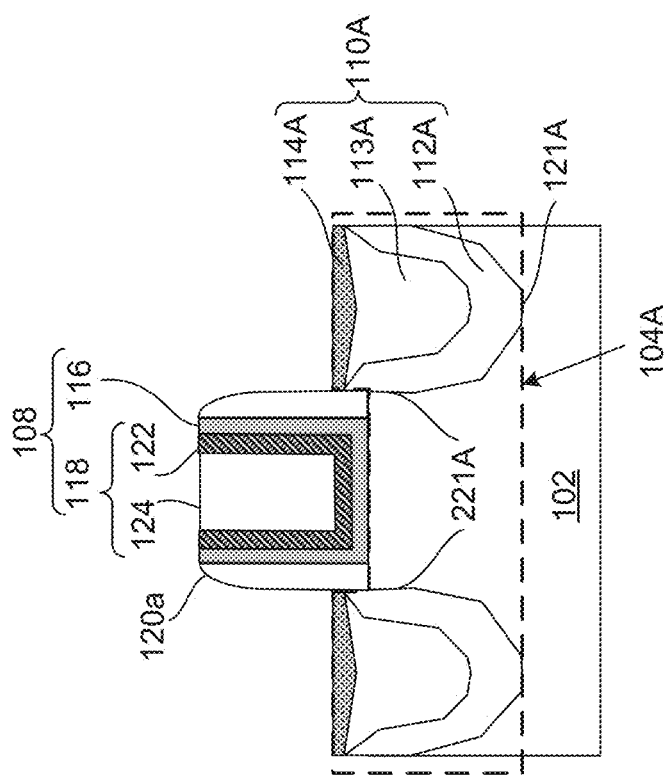
FIG. 2 is a cross-sectional view of an exemplary finFET of FIG. 1 along line A-A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "about" as used herein indicates the value of a given quantity varies by ±10% of the value, unless noted otherwise.

As used herein, the term "selectivity" refers to the ratio of the etch rates of two materials under the same etching conditions.

As used herein, the term "substrate" describes a material onto which subsequent material layers are added. The substrate itself may be patterned, and materials added on top of it may also be patterned, or may remain without patterning. Furthermore, "substrate" may be any of a wide array of semiconductor materials such as silicon, germanium, gallium arsenide, indium phosphide, etc. Alternatively, the substrate may be electrically non-conductive such as a glass or sapphire wafer.

As used herein, the term "high-k" refers to a high dielectric constant. In the field of semiconductor device structures and manufacturing processes, high-k refers to a dielectric constant that is greater than the dielectric constant of $SiO_2$ (i.e., greater than 3.9).

As used herein, the term "vertical" means nominally perpendicular to the surface of a substrate.

As used herein, the term "merged fin structure" refers to a fin structure having a merged epitaxial region grown epitaxially from two or more unmerged epitaxial regions of the fin structure.

As used herein, the term "spacing" refers to a horizontal dimension between elements.

Overview

This disclosure provides various exemplary epitaxial fin structures of finFETs in an integrated circuit. This disclosure also provides exemplary methods for fabricating the same with improved trade-off between the desired epitaxial fin structures of different finFETs in the integrated circuit. For example, a fabrication method is described herein for improving the currently existing trade-off between the desired dimension of contact areas on merged fin structures and the desired volume of unmerged fin structures of finFETs in an integrated circuit.

Exemplary finFETs

Figure 1:
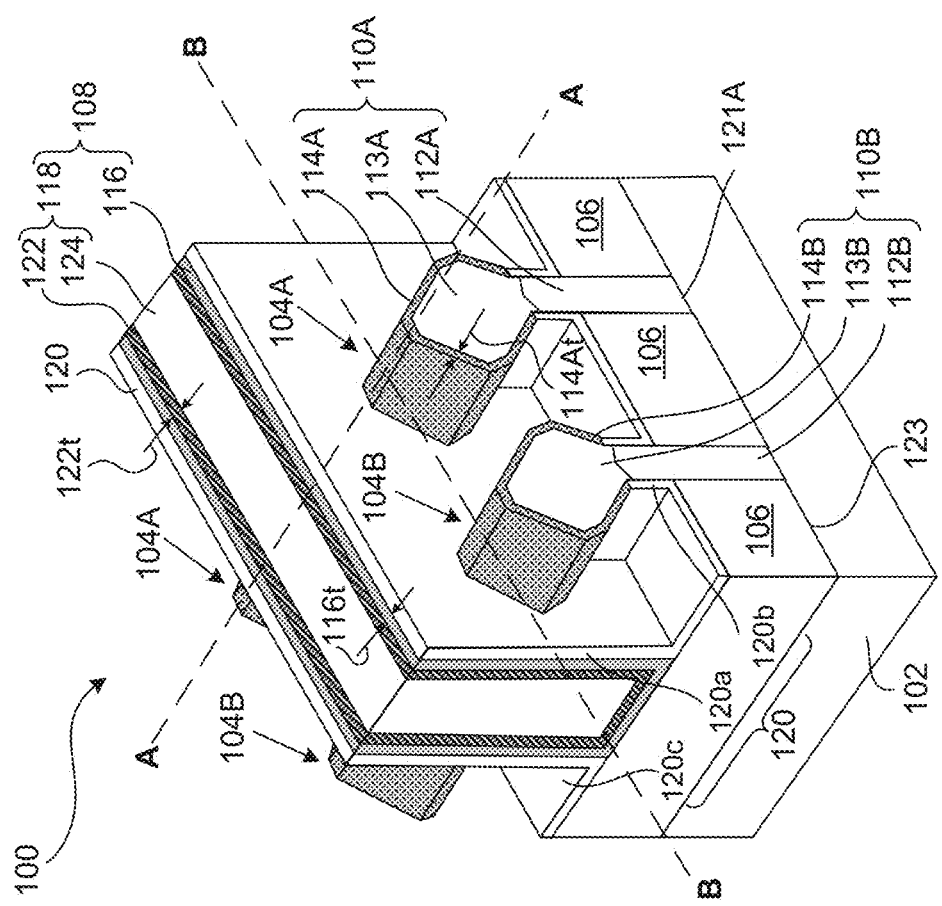
FIG. 1 is an isometric view of exemplary finFETs.

FIG. 1 is an isometric view of a pair of exemplary finFETs 100 in an integrated circuit taken after a gate replacement process. FIG. 1 is for illustrative purposes and is not drawn to scale.

FinFETs 100 are formed on a substrate 102, and includes fin structures 104A and 104B, shallow trench isolation (STI) regions 106, a gate structure 108 disposed on fin structures 104A and 104B, and spacer 120. The isometric view of FIG. 1 is taken after formation of gate structure 108 in a gate replacement process. FIG. 1 shows one gate structure 108. However, there may be additional gate structure(s) (not shown) similar and parallel to gate structure 108. In addition, finFETs 100 may be incorporated into the integrated circuit through the use of other structural components such as source/drain (S/D) contacts, gate contacts, vias, interconnect metal layers, dielectric layers, passivation layers, etc., that are omitted for the sake of clarity.

FinFETs 100 may be configured as two single-fin finFETs, each having respective fin structures 104A and 104B. Alternatively, finFETs 100 may be configured as a multi-fin finFET having fin structures 104A and 104B. The cross-sectional shape of fin structures 104A and 104B is illustrative and is not intended to be limiting.

Substrate 102 is a physical material on which finFETs 100 are formed. Substrate 102 includes a semiconductor material such as, but not limited to, silicon, germanium, a compound semiconductor including silicon carbide, gallium arsenide, gallium phosphide, indium phosphide, indium arsenide, indium antimonide, an alloy including silicon germanium carbide, silicon germanium, gallium arsenic phosphide, gallium indium phosphide, gallium indium arsenide, gallium indium arsenic phosphide, aluminum indium arsenide, aluminum gallium arsenide, or a combination thereof. In some embodiments, substrate 102 comprises a crystalline silicon substrate (e.g., a silicon wafer). In some embodiments, substrate 102 includes an epitaxial layer (epi-layer), and/or includes a silicon-on-insulator (SOI) structure. Further, substrate 102 may be doped with p-type dopants, such as boron, indium, aluminum, or gallium, or n-type dopants, such as phosphorus or arsenic. The doped substrate 102 may be configured for an n-type finFET, or alternatively configured for a p-type finFET.

STI regions 106 provide electrical isolation of fin structures 104A and 104B from each other and from neighboring active and passive elements (not illustrated in FIG. 1) integrated with or deposited onto substrate 102. STI regions 106 are made of dielectric material. In some embodiments, STI regions 106 include silicon oxide, silicon nitride, silicon oxynitride, fluorine-doped silicate glass (FSG), a low-k dielectric material, and/or other suitable insulating material. In some embodiments, STI regions 106 include a multi-layer structure.

Gate structure 108 traverses fin structures 104A and 104B. The fin regions of fin structures 104A and 104B underlying gate structure 108 define the channel regions of finFETs 100. Gate structure 108 includes a gate electrode 118 and a dielectric layer 116 adjacent to and in contact with gate electrode 118. In some embodiments, a thickness 116t of dielectric layer 116 is in the range of 1 nm to 5 nm. Gate structure 108 may further include capping layers, etch stop layers, and/or other suitable materials in various embodiments.

Dielectric layer 116 traverses fin structures 104A and 104B. In some embodiments, dielectric layer 116 includes one or more layers of silicon oxide, silicon nitride, silicon oxynitride, or high-k dielectric materials such as hafnium oxide ($HfO_2$), $TiO_2$, HfZrO, $Ta_2O_3$, $HfSiO_4$, $ZrO_2$, $ZrSiO_2$, or a combination thereof. Alternatively, high-k dielectric materials may comprise metal oxides. Examples of metal oxides used for high-k dielectrics include oxides of Li, Be, Mg, Ca, Sr, Sc, Y, Zr, Al, La, Ce, Pr, Nd, Sm, Eu, Gd, Tb, Dy, Ho, Er, Tm, Yb, Lu, and/or mixtures thereof. In some embodiments, dielectric layer 116 includes a single layer or a stack of insulating material layers. Dielectric layer 116 may be formed by chemical vapor deposition (CVD), atomic layer deposition (ALD), physical vapor deposition (PVD), e-beam evaporation, or other suitable process. Spacer 120 includes insulating material such as silicon oxide, silicon nitride and protect the underlying regions during subsequent processing of finFETs. Spacer 120 includes spacer portions 120a that form sidewalls of gate structure 108, spacer portions 120b that form sidewalls of fin structures 104A and 104B, and spacer portions 120c that form protective layers on STI regions 106.

Gate electrode 118 may include a gate work function metal layer 122 and a gate metal fill layer 124. In some embodiments, gate work function metal layer 122 is disposed on dielectric layer 116. Gate work function metal layer 122 may include a single metal layer or a stack of metal layers. The stack of metal layers may include metals having work functions similar to or different from each other. In some embodiments, gate work function metal layer 122 includes any suitable material, such as aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Exemplary work function metal(s) that may be included in gate work function metal layer 122 in a p-type device include TiN, TaN, Ru, Mo, Al, WN, $ZrSi_2$, $MoSi_2$, $TaSi_2$, $NiSi_2$, WN, other suitable p-type work function metals, or combinations thereof. Exemplary work function metal(s) that may be included in work function metal layer 122 in an n-type device include Ti, Ag, TaAl, TaAlC, TiAlN, TaC, TaCN, TaSiN, Mn, Zr, other suitable n-type work function materials, or combinations thereof. Gate work function metal layer 122 may be formed using a suitable process such as ALD, CVD, PVD, plating, or combinations thereof. In some embodiments, a thickness 122t of gate work function metal layer 122 is in the range of 2 nm to 15 nm.

Gate metal fill layer 124 may include a single metal layer or a stack of metal layers. The stack of metal layers may include metals different from each other. In some embodiments, gate metal fill layer 124 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof.

Gate metal fill layer 124 may be formed by ALD, PVD, CVD, or other suitable conductive material deposition process.

For the ease of discussion FIG. 1 will be further described with respect to fin structure 104A. Fin structures 104A and 104B are similar in structure and composition with respect to each other and it should be understood that discussion of fin structure 104A applies to fin structure 104B unless mentioned otherwise.

Fin structure 104A includes epitaxial regions 110A disposed on either side of gate structure 108. Fin regions of fin structure 104A underlying gate structure 108 are regions formed from patterned portions of substrate 102 as described in detail below. Epitaxial regions 110A may form interfaces 121A with substrate 102 and interfaces (not shown in FIG. 1; shown as 221A in FIG. 2) with portions of fin structure 104A underlying gate structure 108. In some embodiments, interfaces 121A are coplanar with interfaces 123 formed between STI regions 106 and substrate 102. In some embodiments, interfaces 121A are either above or below the level of interfaces 123. In some embodiments, epitaxial regions 110A may be formed on partially recessed fin regions (not shown) on substrate 102. These partially recessed fin regions may be fin structure 104A portions that are not underlying gate structure 108. Top surfaces of these partially recessed fin regions may form interfaces (not shown) with epitaxial regions 110A and these interfaces may be above the level of interfaces 123. Bottom surfaces of these partially recessed fin regions may form interfaces (not shown) with substrate 102 and these interfaces may be either above or below the level of interfaces 123.

Epitaxial regions 110A are configured to function as S/D regions of finFETs 100 and include epitaxially-grown semiconductor material. In some embodiments, the epitaxially grown semiconductor material is the same material as the material of substrate 102. In some embodiments, the epitaxially-grown semiconductor material includes a different material from the material of substrate 102 and imparts a strain on the channel regions underlying gate structure 108. Since the lattice constant of such epitaxially grown semiconductor material is different from the material of substrate 102, the channel regions are strained to advantageously increase carrier mobility in the channel regions of finFETs 100. The epitaxially-grown semiconductor material may include semiconductor material such as germanium or silicon; or compound semiconductor materials, such as gallium arsenide, aluminum gallium arsenide; or semiconductor alloy, such as silicon germanium, or gallium arsenide phosphide.

In some embodiments, epitaxial regions 110A are grown by CVD, e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, epitaxial regions 110A are grown by an epitaxial deposition/partial etch process, which repeats the epitaxial deposition/partial etch process at least once. Such repeated deposition/partial etch process is also called a cyclic deposition-etch (CDE) process. In some embodiments, epitaxial regions 110A are grown by selective epitaxial growth (SEG), where an etching gas is added to promote the selective growth of semiconductor material on the exposed surfaces of substrate 102, but not on insulating material (e.g., dielectric material of STI regions 106).

Epitaxial regions 110A may be in-situ doped during the epitaxial growth process. In various embodiments, epitaxial regions 110A may be doped with p-type dopants, such as boron, indium, or gallium; n-type dopants, such as phosphorus or arsenic; and/or combinations thereof; SiGe epitaxial regions 110A may be doped with p-type dopants, such as boron, gallium, or indium, n-type dopants, such as phosphorus or arsenic, and/or combinations thereof; Si epitaxial regions 110A may be doped with carbon and/or phosphorous. For p-type in-situ doping, p-type doping precursors, such as, but not limited to, diborane ($B_2H_6$), boron trifluoride ($BF_3$), and/or other p-type doping precursors can be used. For n-type in-situ doping, n-type doping precursors, such as, but not limited to, phosphine ($PH_3$), arsine ($AsH_3$), and/or other n-type doping precursor can be used. By using the in-situ doping process, the dopant concentration of the epitaxially-grown semiconductor material can be desirably controlled and achieved. In some embodiments, epitaxial regions 110A are not in-situ doped, and an ion implantation process is performed to dope epitaxial regions 110A.

Each of epitaxial regions 110A may include sub-regions 112A, 113A, and 114A. Sub-regions 112A, 113A, and 114A are epitaxially grown. In some embodiments, sub-regions 112A, 113A, and 114A have SiGe and differ from each other based on, for example, doping concentration, epitaxial growth process conditions, and/or relative concentration of Ge with respect to Si. For example, the atomic percent Ge in sub-region 112A is less than the atomic percent Ge in sub-region 113A and greater than the atomic percent Ge in sub-region 114A. In some embodiments, the atomic percent Ge in sub-region 112A is equal to the atomic percent Ge in sub-region 113A, but greater than the atomic percent Ge in sub-region 114A. In some embodiments, sub-region 112A includes Ge in a range from 15 atomic percent to 35 atomic percent, while sub-region 113A includes Ge in a range from 35 atomic percent to 70 atomic percent and sub-region 114A includes less than about 25 atomic percent Ge with any remaining atomic percent being Si in sub-regions 112A, 113A, and 114A.

Sub-regions 112A, 113A, and 114A may be epitaxially grown under a pressure of 10 Torr to 300 Torr, at a temperature of 500° C. to 700° C. using reaction gases such as HCl as an etching agent, $GeH_4$ as Ge precursor, dichlorosilane (DCS) and/or $SiH_4$ as Si precursor, $B_2H_6$ as B dopant precursor, $H_2$, and/or $N_2$. To achieve different concentration of Ge in sub-regions 112A, 113A, and 114A, the ratio of a flow rate of Ge to Si precursors may be varied during their respective growth process. For example, a Ge to Si precursor flow rate ratio in a range from 9 to 25 is used during the epitaxial growth of sub-region 113A, while a Ge to Si precursor flow rate ratio less than about 6 is used during the epitaxial growth of sub-region 114A. Sub-region 114A may have a thickness 114At in the range of 2 nm to 7 nm and may act as etch stop layers for sub-region 113A during subsequent processing of finFETs 100 and/or other devices in the integrated circuit.

Sub-regions 112A, 113A, and 114A may have varying dopant concentration with respect to each other. For example, sub-region 112A may be undoped or may have a dopant concentration lower than the dopant concentrations of sub-regions 113A and 114A. In some embodiments, sub-region 112A has a dopant concentration less $5 \times 10^{20}$ atoms/cm$^3$, while sub-region 113A has a dopant concentration in a range from $1 \times 10^{20}$ to $2 \times 10^{21}$ atoms/cm$^3$ and sub-region 114A has a dopant concentration in a range from $1 \times 10^{20}$ to $3 \times 10^{21}$ atoms/cm$^3$.

In some embodiments, fin structure 104B includes epitaxial regions 110B having sub-regions 112B, 113B, and 114B that are similar in structure, composition, and function to epitaxial regions 110A having sub-regions 112A, 113A, and 114A.

FIG. 2 is a cross-sectional view of a first one of finFETs 100 along line A-A of FIG. 1. It is noted that the illustrations of exemplary finFETs 100 in FIGS. 1-2 may not be to scale. The cross-sectional view shows an exemplary profile of gate structure 108, spacer portions 120a, fin structure 104A including sub-regions 112A, 113A, and 114A. FinFETs 100 includes interfaces 121A with substrate 102 and interfaces 221A with regions of fin structure 104A underlying gate structure 108.

Figure 3:
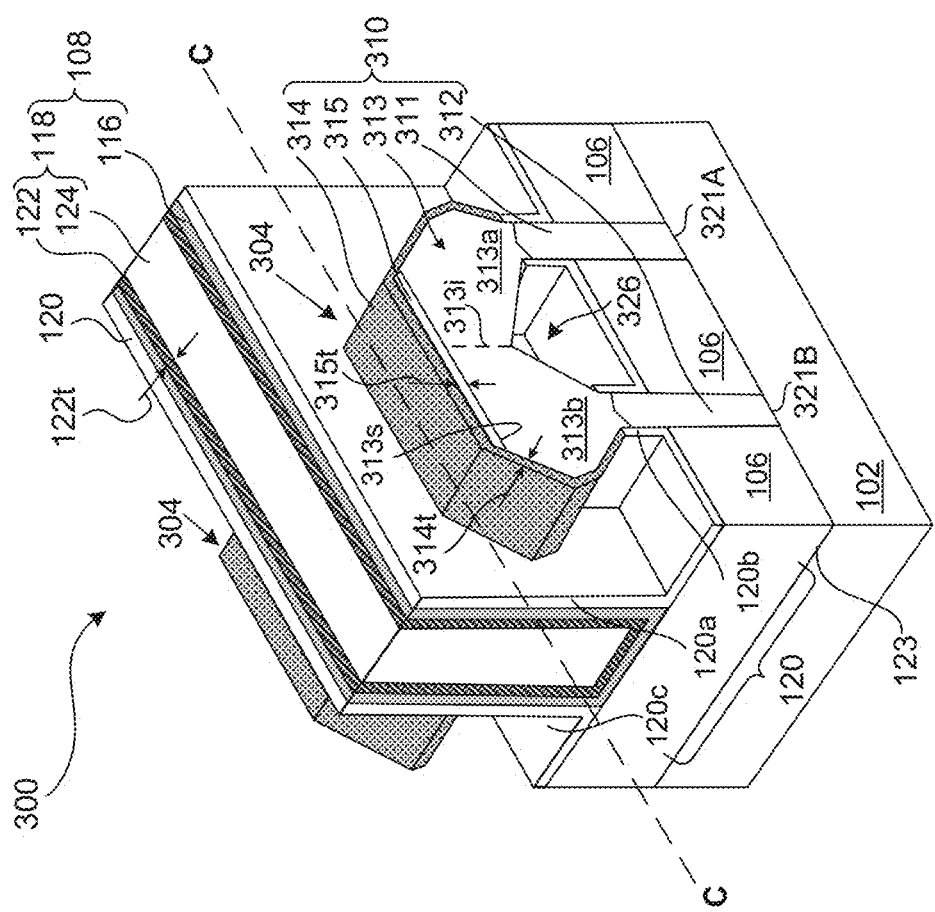
FIG. 3 is an isometric view of an exemplary finFET.

FIG. 3 is an isometric view of an exemplary finFET 300 in an integrated circuit taken after a gate replacement process. FIG. 3 is for illustrative purposes and is not drawn to scale. FinFETs 100 and 300 may be part of the same integrated circuit and may have similar structures, which are illustrated in FIG. 2

FinFET 300 includes fin structure 304. Similar to finFETs 100, finFET 300 includes shallow trench isolation (STI) regions 106, gate structure 108 disposed on fin structure 304, and spacer 120. FIG. 2 shows one gate structure 108. However, there may be additional gate structure(s) (not shown) similar and parallel to gate structure 108. In addition, finFET 300 may be incorporated into the integrated circuit through the use of other structural components such as source/drain (S/D) contacts, gate contacts, vias, interconnect metal layers, dielectric layers, passivation layers, etc., that are omitted for the sake of clarity.

Fin structure 304 includes epitaxial regions 310 disposed on both opposing sides of gate structure 108. Fin regions of fin structure 304 underlying gate structure 108 are regions formed from patterned portions of substrate 102 as described in detail below. Epitaxial regions 310 may form interfaces 321A and 321B with substrate 102 and interfaces (not shown) with regions of fin structure 304 underlying gate structure 108. In some embodiments, interfaces 321A and 321B are coplanar with interfaces 123 formed between STI regions 106 and substrate 102. In some embodiments, interfaces 321A and 321B are either above or below the level of interfaces 123.

Epitaxial regions 310 are configured to function as S/D regions of finFET 300 and include epitaxially grown semiconductor material. In some embodiments, the epitaxially grown semiconductor material is the same material as the material of substrate 102. In some embodiments, the epitaxially grown semiconductor material includes a different material from the material of substrate 102 and imparts a strain on the channel regions underlying gate structure 108. The epitaxially-grown semiconductor material may include semiconductor material such as germanium or silicon; or compound semiconductor materials, such as gallium arsenide, aluminum gallium arsenide; or semiconductor alloy, such as silicon germanium, or gallium arsenide phosphide. In some embodiments, semiconductor material of epitaxial regions 110A and 110B of finFETs 100 and epitaxial regions 310 of finFET 300 are similar in composition with respect to each other.

In some embodiments, epitaxial regions 310 are grown by CVD, e.g., LPCVD, ALCVD, UHVCVD, RPCVD; MBE processes; any suitable epitaxial process; or any combinations thereof. In some embodiments, epitaxial regions 310 are grown by CDE process. Further, epitaxial regions 310 may be in-situ doped during the epitaxial growth process or by an ion implantation process post the epitaxial growth process. In various embodiments, epitaxial regions 310 may be doped with p-type dopants, such as boron, indium, or gallium; n-type dopants, such as phosphorus or arsenic; and/or combinations thereof; SiGe epitaxial regions 310 may be doped with p-type or n-type dopants, and/or combinations thereof; Si epitaxial regions 310 may be doped with carbon and/or phosphorous. For p-type in-situ doping, p-type doping precursors, such as, but not limited to, $B_2H_6$, $BF_3$, and/or other p-type doping precursors can be used. For n-type in-situ doping, n-type doping precursors, such as, but not limited to, $PH_3$, $AsH_3$, and/or other n-type doping precursor can be used.

Each of epitaxial regions 310 may include sub-regions 311, 312, 313, 314, and 315. Sub-regions 311 and 312 are epitaxially grown on different portions of substrate 102 and form respective interfaces 321A and 321B with substrate 102. As shown in FIG. 3, merged sub-region 313 may include portions 313a and 313b, which are epitaxially grown from respective unmerged sub-regions 311 and 312 and are merged at interface 313i. Fin structure 304 may be referred herein as merged fin structure because of its merged epitaxial portions 313a and 313b, while fin structures 104.1A and 104B of finFETs 100 (FIG. 1) may be referred herein as unmerged fin structures. Further, sub-region 315 may be epitaxially grown on top surface 313s of sub-region 313. Top surfaces 313s may be a (100) crystal plane of sub-regions 313. Sub-region 314 are epitaxially grown on sub-regions 313 and 315. Sub-region 314 may have a thickness 314t in the range of 2 nm to 7 nm and sub-region 315 may have a thickness 315t in the range of 1 nm to 3 nm.

Sub-region 314 may act as etch stop layer for sub-regions 313 and 315 during subsequent processing of finFET 300. In some embodiments, sub-region 315 is configured to act as a buffer layer, for example, to protect sub-region 313 from being etched back and the area of top surface 313s from being reduced during subsequent etch back processing of other devices fabricated (e.g., finFETs 100) along with finFET 300 in the integrated circuit. The subsequent etch back processing may be used, for example, to control the shape and volume of fin structures (e.g., fin structures 104A, 104B) of other finFETs (e.g., finFETs 100) fabricated along with finFET 300 in the integrated circuit. As a result, in some embodiments, the presence of sub-region 315 helps to improve or eliminate trade-off between achieving the desired area (e.g., area of top surface 313s) for subsequent formation of contact structures on merged fin structures (e.g., fin structure 304) and the desired volume for epitaxial regions (e.g., epitaxial regions 110A, 110B) of unmerged fin structures (e.g., fin structures 104A, 104B) of finFETs (e.g., finFETs 100) in the integrated circuit. In some embodiments, the finFETs such as finFETs 100 with unmerged smaller fin structures such as fin structures 104A and 104B may be used as pull-up transistors in SRAM bit cells.

In some embodiments, sub-regions 311, 312, 313, 314, and 315 have SiGe and differ from each other based on, for example, doping concentration, epitaxial growth process conditions, and/or relative concentration of Ge with respect to Si. For example, atomic percent Ge in sub-regions 311 and 312 is less than atomic percent Ge in sub-region 313 and greater than atomic percent Ge in sub-regions 314 and 315. In some embodiments, atomic percent Ge in sub-regions 311 and 312 is equal to atomic percent Ge in sub-region 313, but greater than atomic percent Ge in sub-regions 314 and 315. In some embodiments, sub-regions 311 and 312 each include Ge in a range from 15 atomic percent to 35 atomic percent, while sub-region 313 includes Ge in a range from 35 atomic percent to 70 atomic percent with any remaining atomic percent being Si. In some embodiments, sub-region 315 includes Ge in a range from 10 atomic percent to 15 atomic percent, while sub-region 314 includes less than about 25 atomic percent Ge with any remaining atomic percent being Si.

Sub-regions 311, 312, 313, 314, and 315 may be epitaxially grown under a pressure of 10 Torr to 300 Torr, at a temperature of 500° C. to 700° C. using reaction gases such as HCl as an etching agent, $GeH_4$ as Ge precursor, DCS and/or $SiH_4$ as Si precursor, $B_2H_6$ as B dopant precursor, $H_2$, and/or $N_2$. To achieve different concentrations of Ge in sub-regions 311, 312, 313, 314, and 315, the ratio of flow rate of Ge to Si precursors may be varied during their respective growth process. For example, a Ge to Si precursor flow rate ratio in a range from 9 to 25 is used during the epitaxial growth of sub-region 313, in a range from 3 to 9 is used during the epitaxial growth of sub-region 315, and less than about 6 is used during the epitaxial growth of sub-region 314.

Sub-regions 311, 312, 313, 314, and 315 may have varying dopant concentration with respect to each other. For example, sub-regions 311 and 312 may be undoped or each may have a dopant concentration lower than the dopant concentrations of sub-regions 313, 314, and 315. In some embodiments, sub-regions 311 and 312 each have a dopant concentration less about $5 \times 10^{20}$ atoms/cm$^3$, while sub-region 313 has a dopant concentration in a range from $1 \times 10^{20}$ to $2 \times 10^{21}$ atoms/cm$^3$. In some embodiments, sub-region 314 has a dopant concentration in a range from $1 \times 10^{20}$ to $3 \times 10^{21}$ atoms/cm$^3$, while sub-region 315 has a dopant concentration less than about $2 \times 10^{21}$ atoms/cm$^3$.

Also shown in FIG. 3, an insulating material (e.g., air) comprising void 326 is included within finFET 300. Void 326 may bound by portions of sub-regions 311, 312, 313, STI region 106, and spacer 120. The cross-sectional profile of void 326 is not limited to the pentagon shape shown in FIG. 3, but may have any geometric shape (e.g., circular, triangular, rectangular).

An Example Method for Fabricating a Device

FIGS. 4-8 are isometric views of finFETs 100 or 300 (as illustrated in FIGS. 1-3) at various stages of its exemplary fabrication. FIGS. 9A-12A and 9B-12B are cross-sectional views along lines B-B and C-C of finFETs 100 and 300, respectively at various stages of their exemplary fabrication.

Figure 4:
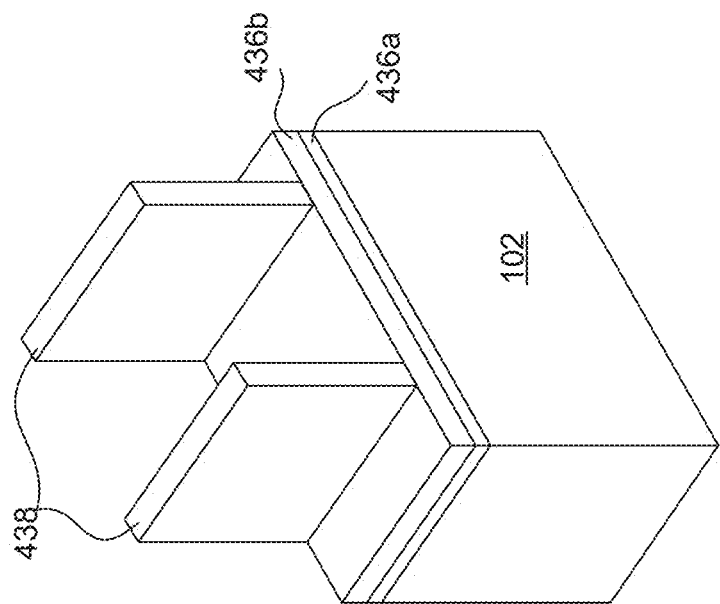
FIGS. 4-8 are isometric views of finFETs at various stages of an exemplary fabrication process.

FIG. 4 is an isometric view of partially fabricated finFETs 100 or 300 after patterning of photoresist on substrate 102 for formation of fin structures 104A and 104B or 304, respectively. Fin structures 104A and 104B or 304 are formed by etching into substrate 102. A pad layer 436a and a hardmask layer 436b are formed on substrate 102. Pad layer 436a may be a thin film comprising silicon oxide formed, for example, using a thermal oxidation process. Pad layer 436a may also act as an etch stop layer for etching hardmask layer 436b. In an embodiment, mask layer 436b is formed of silicon nitride, for example, using LPCVD or PECVD. Hardmask layer 436b is used as a hard mask during subsequent photolithography processes. A patterned photoresist layer 438 is formed on hardmask layer 436b.

Figure 5:
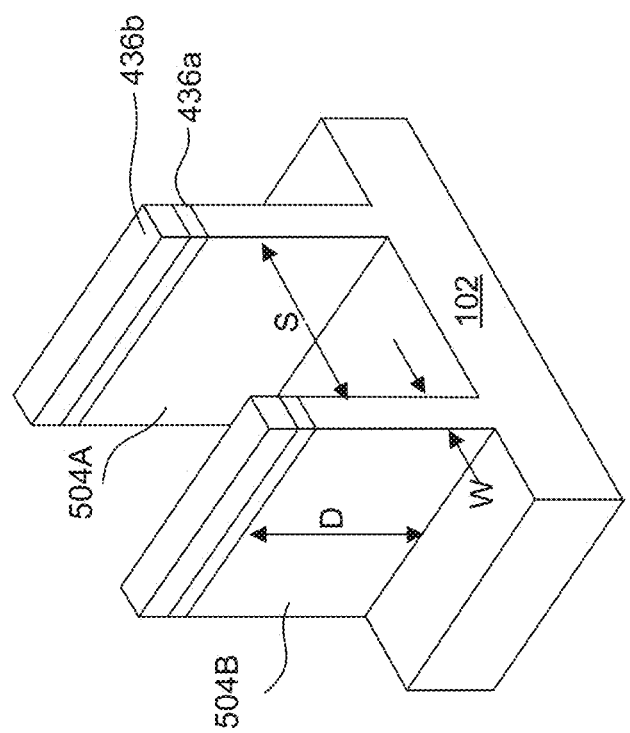

FIG. 5 is an isometric view of partially fabricated finFETs 100 or 300 after the exemplary formation of fin regions 504A and 504B. Portions of hardmask layer 436b and pad layer 436a that are not covered by patterned photoresisit layer 438 are etched to expose underlying substrate 102. The exposed substrate 102 is then etched to form fin regions 504A and 504B. Patterned photoresist 438 is then removed. In some embodiments, fin regions 504A and 504B each have fin widths W smaller than about 30 nm and depth D in a range from 210 nm to 250 nm, while spacing S between fin regions 504A and 504B is less than about 50 nm. The spacing between fin regions 504A and 504B may be varied for different fin structures (e.g., fin structures 104A, 104B, 304) fabricated in an integrated circuit.

Figure 6:
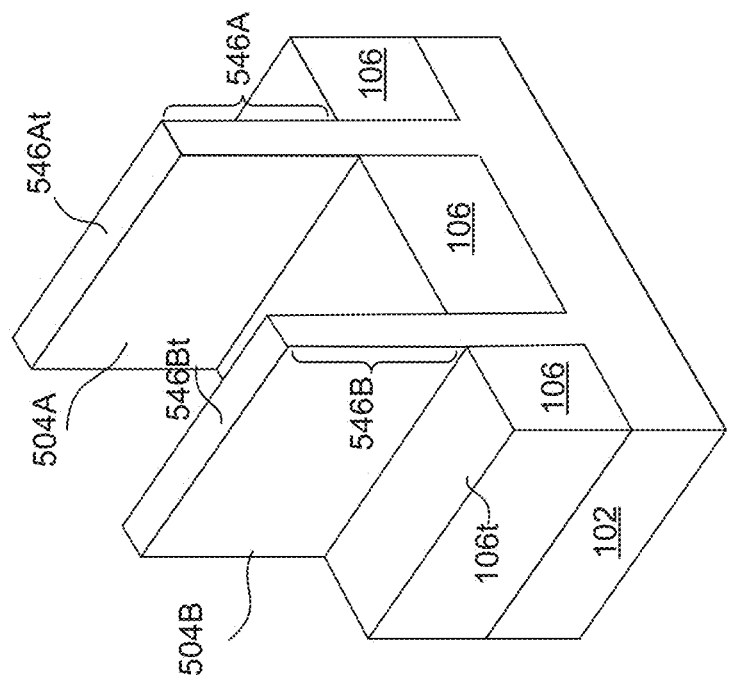

FIG. 6 is an isometric view of partially fabricated finFETs 100 or 300 after the exemplary formation of STI regions 106. The formation of STI regions 106 involves deposition and etching of a dielectric material. The dielectric material may include silicon oxide. In some embodiments, other dielectric materials, such as silicon nitride, silicon oxynitride, fluoride-doped silicate glass (FSG), or a low-k dielectric material, may also be used. In some embodiments, the dielectric material may be formed using a flowable CVD (FCVD) process, a high-density-plasma (HDP) CVD process, using silane ($SiH_4$) and oxygen ($O_2$) as reacting precursors. In other embodiments, the dielectric material may be formed using a sub-atmospheric CVD (SACVD) process or high aspect-ratio process (HARP), wherein process gases may comprise tetraethoxysilane (TEOS) and/or ozone ($O_3$). In yet other embodiments, the dielectric material may be formed using a spin-on-dielectric (SOD) such as hydrogen silsesquioxane (HSQ) or methyl silsesquioxane (MSQ).

A chemical mechanical polishing or a wet etching is then performed to remove hardmask layer 436b and pad layer 436a. This removal is followed by an etching of the dielectric material deposited on substrate 102 to form STI regions 106 as shown in FIG. 6. Etching the dielectric material may be performed using a wet etching process, for example, by dipping substrate 102 in hydrofluoric acid (HF). Alternatively, the etching operation may be performed using a dry etching process, for example, using $CHF_3$ or $BF_3$ as etching gases. Upper fin portions 546A and 546B of fin regions 504A and 504B, respectively, protruding over flat top surfaces 106t of STI regions 106 are used to form channel regions of finFETs 100 or 300. Upper fin portions 546A and 546B may comprise top surfaces 546At and 546Bt, respectively. In some embodiments, flat top surfaces 106t of STI regions 106 are lower than top surfaces 546At and 546.5t. In some embodiments, a vertical dimension of each of the upper fin portions 546A and 546.5 ranges from 15 nm to 50 nm. In another embodiment, a vertical dimension of each of the upper fin portions 546A and 546.5 ranges from 20 nm to 40 nm. In another embodiment, a vertical dimension of each of the upper fin portions 546A and 546B ranges from 25 nm to 35 nm.

Figure 7:
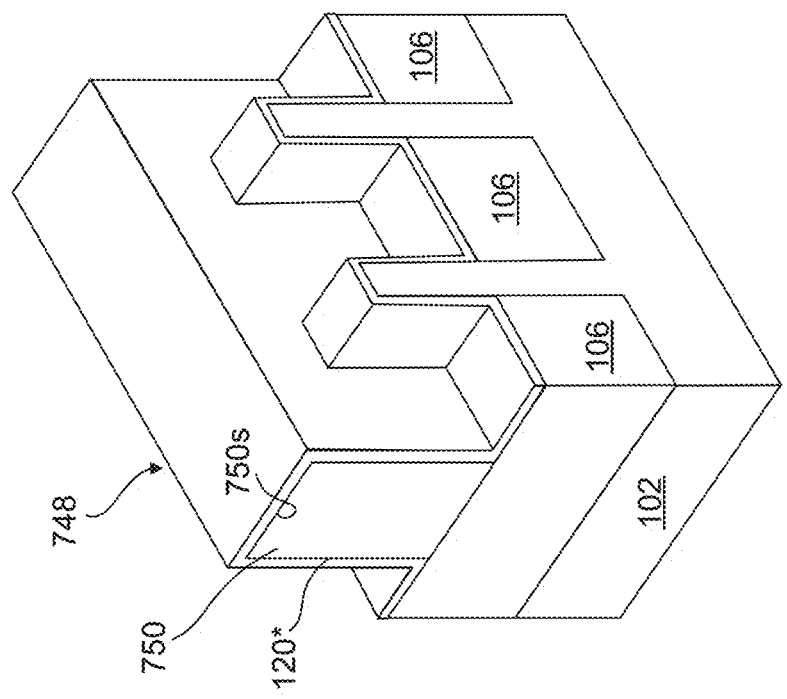

FIG. 7 is an isometric view of a partially fabricated finFETs 100 or 300 after the exemplary formation of a structure 748 on fin regions 504A and 504B and STI regions 106. Structure 748 includes a patterned polysilicon structure 750 and unpatterned spacer 120*. Patterned polysilicon structure 750 is formed over top surfaces 106t of STI regions 106 and wrapped around surfaces of fin regions 504A and 504B protruding over STI regions 106. Unpatterned spacer 120* is disposed to blanket exposed surfaces of patterned polysilicon 750 and to blanket top surfaces 106t of STI regions 106 and surfaces of fin regions 504A and 504B protruding over STI regions 106 that are not covered by patterned polysilicon structure 750.

Patterned polysilicon structure 750 is formed by any suitable process. For example, patterned polysilicon structure 750 can be formed by a process including deposition, photolithography, and etching. Deposition processes include CVD, PVD, ALD, other suitable methods, and/or combinations thereof. Photolithography includes photoresist coating (e.g., spin-on coating), soft baking, mask aligning, exposure, post-exposure baking, developing the photoresist, rinsing, drying (e.g., hard baking), other suitable processes, and/or combinations thereof. Etching processes include dry etching, wet etching, and/or other etching methods (e.g., reactive ion etching). Unpatterned spacer 120* may include dielectric material such as silicon oxide, silicon carbide, silicon nitride, silicon oxy-nitride, or other suitable material. A blanket layer of a dielectric material may be formed over patterned polysilicon structure 750 by CVD, PVD, ALD, or other suitable technique.

Figure 8:
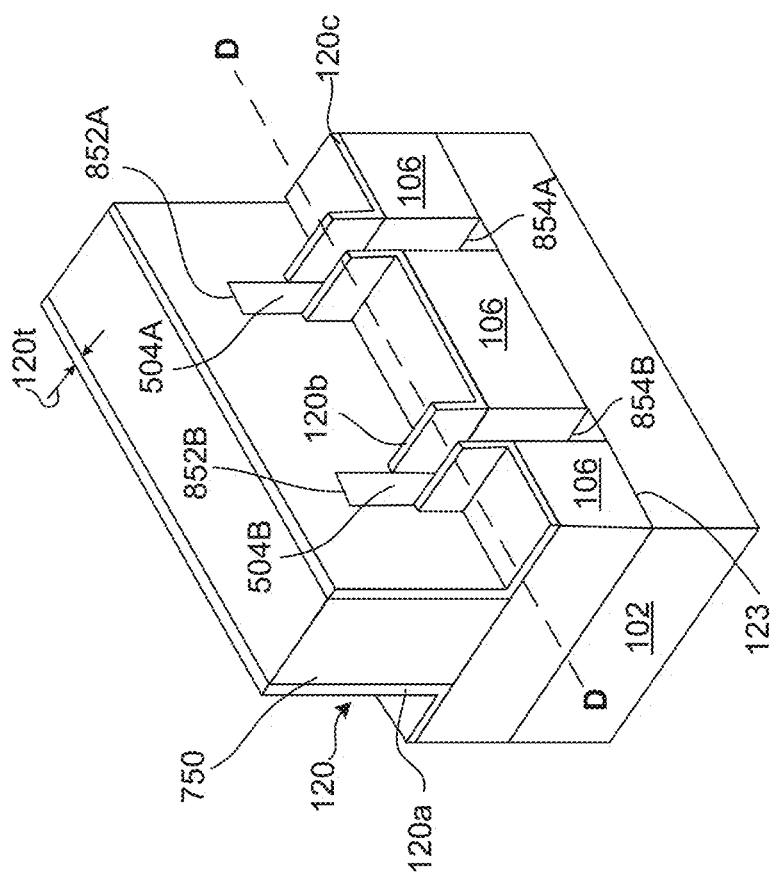

FIG. 8 is an isometric view of partially fabricated finFETs 100 or 300 after the exemplary formation of spacer 120 and recessed fin regions 854A and 854B. Unpatterned spacer 120* is dry etched using, for example, reactive ion etching (RIE) to form spacer 120 having spacer regions 120a, 120b, and 120c as shown in FIG. 8. Spacer 120 may have a thickness 120t in a range from 5 nm to 15 nm. The portions of fin regions 504A and 504B that are not covered by patterned polysilicon structure 750 and spacer 120a are recessed to form recessed fin regions 854A and 854B. The unrecessed portions of fin regions 504A and 504B underlies spacer regions 120a and patterned polysilicon structure 750 and form respective interfaces 852A and 852B with spacer regions 120a and patterned polysilicon structure 750. In one embodiment, a biased etching process is performed to form recessed fin regions 854A and 854B. The etching process may be performed under a pressure of 1 mTorr to 1000 mTorr, a power of 50 W to 1000 W, a bias voltage of 20 V to 500 V, at a temperature of 40° C. to 60° C., and using a HBr and/or $Cl_2$ as etch gases. In some embodiments, top surface 750s of patterned polysilicon structure 750 is protected from being etched during the etching process by a hardmask layer (not shown) on the top surface. In some embodiments, the portions of fin regions 504A and 504B that are not covered by patterned polysilicon structure 750 and spacer 120a are partially recessed (not shown) and top surfaces of these partially recessed fin regions are at a level higher than the level of interfaces 123.

FIG. 9A is a cross-sectional view of the structure of FIG. 8 along line D-D after the exemplary formation of epitaxial sub-regions 311 and 312 and epitaxial merged sub-region 313* of finFET 300. FIG. 9B is a cross-sectional view of the structure of FIG. 8 along line D-D after exemplary formation of epitaxial sub-regions 112A, 112B, 113A*, and 113B* of finFETs 100. Epitaxial sub-regions 112A through 112B, and 113A* through 113B* are similar in structure and composition with respect to each other and it should be understood that discussion of sub-regions 112A and 113A* applies to sub-regions 112B and 113B*, respectively, unless mentioned otherwise It should be noted that the exemplary cross-sectional profile of structure of FIG. 8 may not be to scale in FIGS. 9A-9B. The structures of FIGS. 9A and 9B may be formed concurrently on different portions of substrate 102 to fabricate finFETs 300 and 100 in the same integrated circuit.

Sub-regions 311, 312, 112A, and 112B are epitaxially grown from respective recessed fin regions 854A and 854B and respective unrecessed portions of fin regions 504A and 504B. Sub-regions 113A* and 113B* are epitaxially grown from respective sub-regions 112A and 112B. Sub-region 313* is formed from merging of sub-regions 313a* and 313b* at interface 313i that are epitaxially grown from respective sub-regions 311 and 312 to a desired height level 956. Even though sub-regions 113A*, 113B*, 313a* and 313b* are concurrently epitaxially formed, sub-regions 113A* and 113B* are unmerged when grown to height level 956 unlike sub-regions 313a* and 313b*. The merging of sub-regions 113A* and 113B* during the epitaxial growth may be prevented by having a larger spacing 962 between sub-regions 112A and 112B than spacing 960 between sub-regions 311 and 312. These sub-regions 311, 312, 313*, 112A, 112B, 113A*, and 113B* each includes epitaxially-grown semiconductor material such as, but not limited to SiGe.

In some embodiments, these sub-regions 311, 312, 313*, 112A, 112B, 113A*, and 113B* are grown by an epitaxial deposition/partial etch process, which repeats the epitaxial deposition/partial etch process at least once. Such repeated deposition/partial etch process is also called a cyclic deposition-etch (CDE) process. In some embodiments, these sub-regions are grown by selective epitaxial growth (SEG), where an etching gas is added to promote the selective growth of semiconductor material on the exposed surfaces of recessed fin regions 854A and 854B and respective unrecessed portions of fin regions 504A and 504B, but not on insulating material of STI regions 106. Sub-regions 311, 312, 313*, 112A, 112B, 113A*, and 113B* may be epitaxially grown under a pressure of 10 Torr to 300 Torr, at a temperature of 500° C. to 700° C. using reaction gases such as HCl as an etching agent, $GeH_4$ as Ge precursor, DCS and/or $SiH_4$ as Si precursor, $B_2H_6$ as B dopant precursor, $H_2$, and/or $N_2$. To achieve different concentration of Ge in these sub-regions, the ratio of a flow rate of Ge to Si precursors may be varied during their respective growth process. For example, a Ge to Si precursor flow rate ratio in a range from 9 to 25 is used during the epitaxial growth of sub-regions 313*, 113A*, and 113B*. In some embodiments, sub-regions 311, 312, 112A and 112B each includes Ge in a range from 15 atomic percent to 35 atomic percent, while sub-regions 313*, 113A and 113B* each includes Ge in a range from 35 atomic percent to 70 atomic percent with any remaining atomic percent being Si.

Sub-regions 311, 312, 313*, 112A, 112B, 113A*, and 113B* are in-situ doped during the epitaxial growth process with p-type dopants, such as, but not limited to boron using doping precursors, such as, but not limited to, diborane ($B_2H_6$), boron trifluoride ($BF_3$). Sub-regions 112A, 112B, 311, and 312 are doped to each have a dopant concentration less than about $5\times10^{20}$ atoms/cm$^3$, while sub-regions 113A*, 113B*, and 313* are doped to each have a dopant concentration in a range from $1\times10^{20}$ to $2\times10^{21}$ atoms/cm$^3$.

As shown in FIGS. 9A-9B, sub-regions 313*, 113A*, and 113B* are epitaxially grown simultaneously. However, the shape and volume achieved for these sub-regions 313*, 113A*, and 113B* during the simultaneous growth may not be the desired shape and volume. In some embodiments, it is desirable to reduce the volume of sub-regions 113A* and 113B* without substantially reducing the volume of sub-region 313* and/or reducing area of top surface 313s*, which may define the area for subsequent contact structure formation over sub-region 313*. Also, it may be desirable to increase merging window 958 between sub-regions 113A* and 113B* without substantially reducing the volume of sub-region 313* and/or reducing area of top surface 313s*. Increasing merging window 958 may be desirable to prevent sub-regions 113A* and 113B* from merging at merging window 958 during subsequent deposition of layers and/or epitaxial regions on these sub-regions 113A* and 113B*.

To reduce the volume of sub-regions 113A* and 113B* and increase merging window 958 without substantially reducing the volume of sub-region 313* and/or reducing area of top surface 313s*, a buffer region 315* may be selectively epitaxially grown on sub-region 313* as shown in FIGS. 10A-10B followed by an etching process.

Additionally or alternatively to the structure of FIG. 9B, the structure of FIG. 9C may be concurrently formed with the structure of FIG. 9A on different portions of substrate 102, according to some embodiments. The structure of FIG. 9C may be a part of finFET 100, 300, or another finFET (not shown) on substrate 102, according to some embodiments. After subsequent processing, sub-regions 913A* and 913B* may form unmerged sub-regions similar to respective unmerged sub-regions 113A and 113B. The above discussion of sub-regions 113A*, 113B*, 112A, and 112B applies to sub-regions 913A*, 913B*, 912A, and 912B unless mentioned otherwise. Elements in FIG. 9C with the same annotations as elements in FIGS. 9A-9B are described above.

Sub-regions 913A* and 913B* may be grown epitaxially from respective sub-regions 912A and 912B and may merge at interface 913i, as shown in FIG. 9c, according to some embodiments. In some embodiments, a vertical dimension of interface 913i may be smaller than a vertical dimension of interface 313i. In some embodiments, spacing 964 between between sub-regions 912A and 912B may be larger than spacing 960 between sub-regions 311 and 312, and smaller than spacing 962 between sub-regions 112A and 112B. To reduce the volume of sub-regions 913A* and 913B* and unmerge them at interface 913i, a buffer region 315* may be selectively epitaxially grown on sub-region 313* as shown in FIG. 10A followed by an etching process. The volume reduction and unmerging of sub-regions 913A* and 913B* may be done to form a merging window larger than or similar to merging window 958. The presence of buffer region 315* may help to prevent the volume of sub-region 313* and/or the area of top surface 313s* from being reduced substantially during the unmerging process of sub-regions 913A* and 913B*.

FIGS. 10A-10B are cross-sectional views of the structures of FIGS. 9A-9B, respectively after the exemplary formation of epitaxial buffer region 315*. Epitaxial buffer region 315* may protect sub-region 313* from being substantially etched back during subsequent etch back processing of finFETs 100 to form sub-regions 113A and 113B as in FIG. 1. Buffer region 315* includes epitaxially-grown semiconductor material such as, but not limited to SiGe and is grown by any suitable epitaxial process. Buffer region 315* may be epitaxially grown under a pressure of 10 Torr to 300 Torr, at a temperature of 500° C. to 700° C. using reaction gases such as HCl as an etching agent, GeH$_4$ as Ge precursor, DCS and/or SiH$_4$ as Si precursor, B$_2$H$_6$ as B dopant precursor, H$_2$, and/or N$_2$. In some embodiments, a SiH$_4$/DCS flow rate ratio in a range from 2 to 5 may be used during the growth of buffer region 315*. In some embodiments, a Ge/Si precursor flow rate ratio in a range from 3 to 9 may be used during the epitaxial growth of buffer region 315*. In some embodiments, buffer region 315* includes Ge in a range from 10 atomic percent to 15 atomic percent with any remaining atomic percent being Si. Further, buffer region 315* may be in-situ doped during the epitaxial growth process with p-type dopants, such as, but not limited to boron using doping precursors, such as, but not limited to, diborane (B$_2$H$_6$), boron trifluoride (BF$_3$) to have a dopant concentration less than about $2\times10^{21}$ atoms/cm$^3$.

The portion of buffer region 315* on top surface 313s*, which is a (100) crystal plane of epitaxial sub-region 313*, has a thickness 315t* in a range of 2 nm to 5 nm. Thickness of portions of buffer region 315* on slanted surfaces 313a* and 313b* which are (111) crystal planes of epitaxial sub-region 313*, are subtantially thinner (e.g., less than about 0.5 nm) than portion of buffer region 315* on top surface 313s*. In some embodiments, resultant buffer region 315* is formed on (100) crystal plane and not on (111) plane. Also, to be appreciated there is no resultant epitaxial growth of buffer region on surfaces of sub-regions 113A* and 113B* and/or sub-regions 913A* and 913B*. In some embodiments, one of the factors that help to achieve such profile of buffer region 315* is an E/D ratio that is maintained in a range from 0.5 to 1 during growth of buffer region 315*. The E/D ratio may be defined as the ratio of the flow rate of precursor(s) used for etching to the flow rate of precursor(s) used for material deposition during the epitaxial growth of buffer region 315*. For example, the E/D ratio may be the ratio of the flow rate of HCl to the combined flow rate of GeH$_4$, SiH$_4$, and DCS used during the epitaxial growth of buffer region 315*. The E/D ratio may be adjusted as such to achieve faster growth of epitaxial material along (100) crystal plane compared to (111) crystal plane and faster etch rate of epitaxial material along (111) crystal plane than (100) crystal plane. In some embodiments, the ratio of growth rate along (100) crystal to growth rate along (111) crystal plane is in a range from 5 to 10. Due to the absence of (100) crystal plane in sub-regions 113A* and 113B* and/or sub-regions 913A* and 913B*, buffer regions 315* may be selectively grown on top surface 313s*.

FIGS. 11A-11B are cross-sectional views of the structures formed after the exemplary etch back processing of the structures of FIGS. 10A-10B, respectively. Additionally or alternatively to the structure of FIG. 11B, the structure of FIG. 9C forms a structure similar to the structure of FIG. 11B after the exemplary etch back processing of the structures of FIGS. 10A and 9C. The etch back process may be performed concurrently on the structures of FIGS. 10A-10B, of FIGS. 10A and 9C, or of FIGS. 9C and 10A-10B under a pressure of 10 Torr to 300 Torr, at a temperature of 500° C. to 700° C. using reaction gases such as HCl, GeH$_4$, H$_2$, and/or N$_2$. As shown in FIGS. 11A and 11B, the etch back process reduced the volume of sub-regions 113A* and 113B* and increased merge window 958 to form smaller sub-regions 113A and 113B, and wider merge window 1158 without etch back of sub-region 313* from the height level 956. Similar unmerged smaller sub-regions 113A and 113B may be formed after the etch back process on sub-regions 913A* and 913B*. In some embodiments, sub-region 313 is formed from sub-region 313* in a post-etch process. Surfaces 313a and 313b of sub-region 313 are formed after portions 313c* and 313d* of sub-region 313* (FIG. 10A) are etched back in a direction parallel to top surface 102s of substrate 102. Sub-region 315 is formed from the remaining portion of buffer region 315* post the etch back process.

Figure 12A:
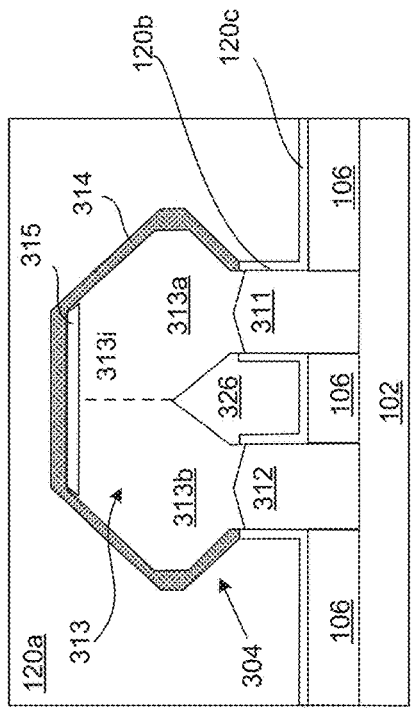
Figure 12B:
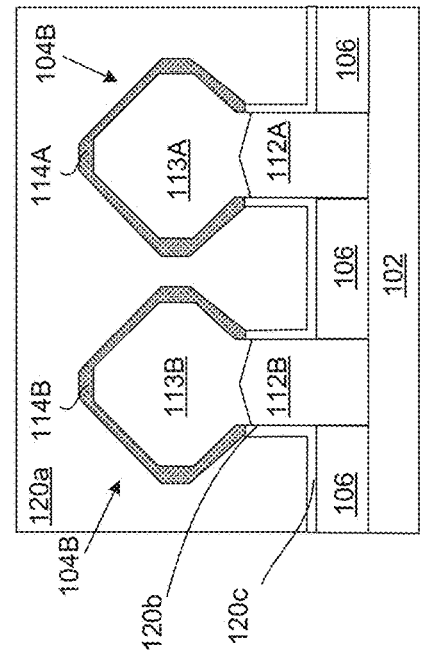

FIGS. 12A-12B are cross-sectional views of the structures of FIGS. 11A-11B, respectively after the exemplary formation of sub-regions 314, 114A and 114B as described above with reference to FIGS. 3 and 1. Sub-regions 314, 114A and 114B each includes epitaxially-grown semiconductor material such as, but not limited to SiGe and is grown by any suitable epitaxial process. Sub-regions 314, 114A and 114B may be epitaxially grown under a pressure of 10 Torr to 300 Torr, at a temperature of 500° C. to 700° C. using reaction gases such as HCl as an etching agent, GeH$_4$ as Ge precursor, DCS and/or SiH$_4$ as Si precursor, B$_2$H$_6$ as B dopant precursor, H$_2$, and/or N$_2$. In some embodiments, Sub-regions 314, 114A and 114B each includes Ge less than about 25 atomic percent with any remaining atomic percent being Si. Further, sub-regions 314, 114A and 114B each may be in-situ doped during the epitaxial growth process with p-type dopants, such as, but not limited to boron using doping precursors, such as, but not limited to, diborane (B$_2$H$_6$), boron trifluoride (BF$_3$) to have a dopant concentration in a range from $1\times10^{20}$ to $3\times10^{21}$ atoms/cm$^3$.

Formation of the structures of FIGS. 12A-12B may be followed by formation of other elements of finFETs 100 and 300 such as gate electrode(s) and gate dielectric(s) using a replacement metal gate (RMG) process, interlayer dielectric layer, S/D contacts, gate contacts, metal gate structure, vias, interconnect metal layers, dielectric layers, passivation layers, etc., that are not shown for the sake of simplicity.

Example Operations for Fabricating FinFETs

Figure 13:
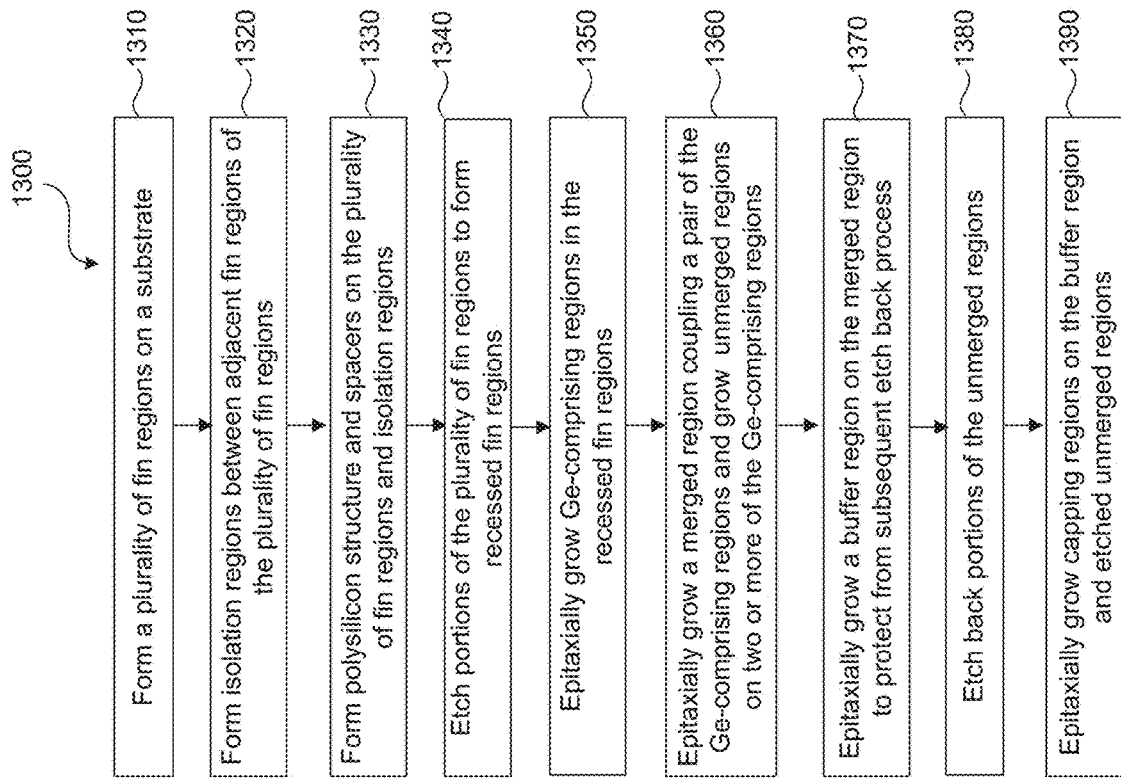
FIG. 13 is a flow diagram of an exemplary method for fabricating finFETs.

FIG. 13 is a flow diagram of an exemplary method 1300 for fabricating finFETs 100 and 200. Solely for illustrative purposes, the operations illustrated in FIG. 13 will be described with reference to the example fabrication process illustrated in FIGS. 4-8, 9A-12A, and 9B-12B. Operations can be performed in a different order or not performed depending on specific applications. It should be noted that method 1300 does not produce completed finFETs 100 and 200. Accordingly, it is understood that additional processes may be provided before, during, and after method 1300, and that some other processes may only be briefly described herein.

In operation 1310, a plurality of fin regions are formed on a substrate. For example, as shown in FIG. 5, a plurality of fin regions similar to fin region 504A are formed on substrate 102. Formation of fin region 504A may include patterning and etching of substrate 102. The patterning may be performed by photolithograpic processes and the etchig may be performed by dry etching (e.g., ME).

In operation 1320, isolation regions are formed on the substrate between adjacent fin regions of the plurality of fin regions. For example, as shown in FIG. 6, STI regions 106 are formed on substrate 102. The formation of STI regions 106 may involve deposition and etching of a dielectric material. The dielectric material may include silicon oxide, silicon nitride, silicon oxynitride, fluoride-doped silicate glass (FSG), or a low-k dielectric material. In some embodiments, the dielectric material may be formed using a FCVD process, a HDPCVD process, using $SiH_4$ and $O_2$ as reacting precursors. In other embodiments, the dielectric material may be formed using a SACVD process or HARP, wherein process gases may comprise TEOS and/or $O_3$. Etching the dielectric material may be performed using a wet etching process, for example, by dipping substrate 102 in hydrofluoric acid (HF). Alternatively, the etching operation may be performed using a dry etching process, for example, using $CHF_3$ or $BF_3$ as etching gases.

In operation 1330, a polysilicon structure and spacers are formed on the fin regions and isolation regions. For example, as shown in FIG. 7, polysilicon structure 750 and spacers 120 are formed on fin region 504A and STI regions 106. Polysilicon structure 750 is formed by a process including deposition, photolithography, and etching. Deposition processes may include CVD, PVD, ALD, other suitable methods, and/or combinations thereof. Etching processes may include dry etching, wet etching, and/or other etching methods (e.g., reactive ion etching). Formation of spacers 120 deposition of a blanket layer of a dielectric material (e.g., silicon oxide, silicon carbide, silicon nitride, silicon oxy-nitride) over polysilicon structure 750 by CVD, PVD, ALD, or other suitable technique followed by an anisotropic etching of the dielectric material to form spacers 120.

In operation 1340, the plurality of fin regions are etched to form recessed fin regions. For example, as shown in FIG. 8, recessed fin regions similar to recessed fin region 854A are formed. Formation of recessed fin region 854A includes etching a portion of fin region 504A that is not covered by polysilicon structure 750 and spacers 120. The etching process may be performed under a pressure of 1 mTorr to 1000 mTorr, a power of 50 W to 1000 W, a bias voltage of 20 V to 500 V, at a temperature of 40° C. to 60° C., and using a HBr and/or $Cl_2$ as etch gases.

In operation 1350, Ge-comprising regions are epitaxially grown in the recessed fin regions of operation 1340. For example, as shown in FIGS. 9A-9B, regions 112A, 112B, 311, and 312 are formed in recessed fin regions similar to recessed fin region 854A. Regions 112A, 112B, 311, and 312 may include SiGe and may be epitaxially grown under a pressure of 10 Torr to 300 Torr, at a temperature of 500° C. to 700° C. using reaction gases such as HCl as an etching agent, $GeH_4$ as Ge precursor, DCS and/or $SiH_4$ as Si precursor, $B_2H_6$ as B dopant precursor, $H_2$, and/or $N_2$. Regions 112A, 112B, 311, and 312 may be undoped or in-situ doped with p-type dopant (e.g., boron) to have a dopant concentration less $5\times10^{20}$ atoms/$cm^3$.

In operation 1350, additionally or alternatively, as shown in FIG. 9C, regions 912A, and 912B maybe formed on in recessed fin regions similar to recessed fin region 854A.

In operation 1360, a merged region is epitaxially grown to couple a pair of the Ge-comprising regions. Further, epitaxial regions that are not merged to each other are grown on two or more of the Ge-comprising regions. For example, as shown in FIGS. 9A-9B, merged region 313* is epitaxially grown to couple regions 311 and 312, and concurrently unmerged regions 113A* and 113B* are epitaxially grown on regions 112A and 112B, respectively. The merging of sub-regions 113A* and 113B* during the epitaxial growth may be prevented by having a larger spacing 962 between regions 112A and 112B than spacing 960 between sub-regions 311 and 312. Merged region 313* and unmerged regions 113A* and 113B* may include SiGe and may be epitaxially grown under a pressure of 10 Torr to 300 Torr, at a temperature of 500° C. to 700° C. using reaction gases such as HCl as an etching agent, $GeH_4$ as Ge precursor, DCS and/or $SiH_4$ as Si precursor, $B_2H_6$ as B dopant precursor, $H_2$, and/or $N_2$. Merged region 313* and unmerged regions 113A* and 113B* may be in-situ doped with p-type dopant (e.g., boron) to have a dopant concentration in a range from $1\times10^{20}$ to $2\times10^{21}$ atoms/$cm^3$.

In operation 1360, additionally or alternatively to the growth of unmerged epitaxial region, merged regions are epitaxially grown on two or more of the Ge-comprising regions that are unmerged in subsequent operation steps. For example, as shown in FIG. 9C, epitaxial regions 913A* and 913B* are concurrently grown with merged region 313* (as shown in FIG. 9A). Regions 913A* and 913B* may be merged at interface 913i. In some embodiments, a vertical dimension of interface 913i may be smaller than a vertical dimension of interface 313i of merged region 313*. The growth process parameters and doping process parameters for forming regions 913A* and 913B* may be similar to regions 113A* and 113B*.

In operation 1370, a buffer region is epitaxially grown on the merged region. For example, as shown in FIGS. 10A-10B, buffer region 315* is formed on merged region 313*. Buffer region 315* may include SiGe and may be epitaxially grown under a pressure of 10 Torr to 300 Torr, at a temperature of 500° C. to 700° C. using reaction gases such as HCl as an etching agent, $GeH_4$ as Ge precursor, DCS and/or $SiH_4$ as Si precursor, $B_2H_6$ as B dopant precursor, $H_2$, and/or $N_2$. During the growth of buffer region 315* a $SiH_4$/DCS flow rate ratio in a range from 2 to 5 and a Ge/Si precursor flow rate ratio in a range from 3 to 9 may be used. An etch/deposition (E/D) ratio that is the ratio of the flow rate of HCl to the combined flow rate of $GeH_4$, $SiH_4$, and DCS may be maintained in a range from 0.5 to 1 during the growth of buffer region 315*. The E/D ratio may be adjusted as such to achieve faster growth of the buffer region material on (100) crystal plane compared to (111) crystal plane and faster etch rate of the buffer region material along (111) crystal plane than (100) crystal plane. Buffer region 315* may be in-situ doped with p-type dopant (e.g., boron) to have a dopant concentration less than about $2\times10^{21}$ atoms/$cm^3$.

In operation 1380, portions of the unmerged regions are etched back. For example, as shown in FIG. 11A-11B, unmerged regions 113A* and 113B* are etched back to form regions 113A and 113B. The etch back process may be performed on the structures of FIGS. 10A-10B under a pressure of 10 Torr to 300 Torr, at a temperature of 500° C. to 700° C. using reaction gases such as HCl, $GeH_4$, $H_2$, and/or $N_2$.

In operation 1380, additionally or alternatively to the etching of the unmerged regions, some merged regions (e.g., regions 913A* and 913B* shown in FIG. 9C) may be etched to unmerge them. For example, the structure of FIG. 9C may be etched to form a structure similar to the structure of FIG. 11B. The etching process parameters for the structure of FIG. 9C may be similar to that used on the structure of FIG. 9B or FIG. 10B.

In operation 1390, capping regions are epitaxially grown on the buffer region and the etched unmerged region. For example, capping region 314 is grown on buffer region 315 formed after the etch process of operation 1380, and capping regions 114A and 114B are formed on the etched back unmerged regions 113A and 113B. Capping regions 314, 114A, and 114B may include SiGe and may be epitaxially grown under a pressure of 10 Torr to 300 Torr, at a temperature of 500° C. to 700° C. using reaction gases such as HCl as an etching agent, $GeH_4$ as Ge precursor, DCS and/or $SiH_4$ as Si precursor, $B_2H_6$ as B dopant precursor, $H_2$, and/or $N_2$. Further, capping regions 314, 114A, and 114B may be in-situ doped with p-type dopant (e.g., boron) to have a dopant concentration in a range from $1\times10^{20}$ to $3\times10^{21}$ atoms/$cm^3$.

Thus, the present disclosure describes various configurations of finFETs in an integrated circuit and methods of fabricating the same simultaneously without trading off between the desired configurations of the various finFETs. In an embodiment, the method includes selectively etching a first fin structure of a first finFET to control its shape and configuration without substantially affecting the shape and configuration of a second fin structure of a second finFET that is being fabricated simultaneously with the first finFET. The second fin structure is protected during the etching of the first fin structure by a selectively epitaxially grown buffer region on the first structure.

Example Embodiments and Benefits

In an embodiment, a semiconductor device includes a fin structure on a substrate, a replacement gate structure disposed on the fin structure, a dielectric region disposed on the substrate. The fin structure includes a source/drain region having first and second epitaxial regions having a first dopant concentration and a merged epitaxial region on the first and second epitaxial regions. The merged epitaxial region has a second dopant concentration different from the first dopant concentration. The source/drain region further includes an epitaxial buffer region on the merged epitaxial region and an epitaxial capping region on the merged epitaxial region and the buffer epitaxial region. The epitaxial buffer region has a third dopant concentration different from the first and second dopant concentrations and the epitaxial capping region has a fourth dopant concentration different from the first, second, and third dopant concentrations.

In a further embodiment, a method of forming a semiconductor device having first and second fin structures on a substrate includes forming a first epitaxial region of the first fin structure and forming a second epitaxial region of the second fin structure. The method further includes forming a buffer region on the first epitaixial region of the first fin structure, performing an etch process to etch back a portion of the second epitaxial region, and forming a capping region on the buffer region and the etched second epitaxial region. The etch process etches back the portion of the second epitaxial region. The buffer region helps to prevents etch back of a top surface of the first epitaxial region during the etch process.

In a still further embodiment, a method of forming a fin structure of a semiconductor device includes forming an insulating region on a substrate, epitaxially growing a first region on the substrate, and epitaxially growing a second region on the substrate. The second region is laterally displaced from the first region by the insulating region. The method further includes epitaxially growing a merged region on the first and second regions, epitaxially growing a buffer region on the merged region, and epitaxially growing a capping region on the buffer region. The buffer regions helps to prevent etch back of a top surface of the merged region during subsequent etch process.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the subjoined claims.

What is claimed is:

1. A method of forming a semiconductor device having first and second fin structures on a substrate, the method comprising:
   forming a first epitaxial region of the first fin structure;
   forming a second epitaxial region of the second fin structure;
   selectively and epitaxially growing a buffer region on the first epitaxial region of the first fin structure while exposing a portion of the second epitaxial region;
   etching back the portion of the second epitaxial region, wherein the buffer region prevents an etch back of a top surface of the first epitaxial region during the etching; and
   forming an epitaxial capping region on the buffer region and the etched second epitaxial region.

2. The method of claim 1, wherein growing the buffer region on the first epitaxial region comprises:
   simultaneously epitaxial growing a material of the buffer region on first and second planes of the first epitaxial region at first and second growth rates, respectively, the first plane being different from the second plane; and
   providing process conditions for the epitaxial growth of the material on the first and second planes such that the first growth rate is faster than the second growth rate.

3. The method of claim 1, wherein growing the buffer region on the first epitaxial region comprises:
- simultaneously epitaxially growing a material of the buffer region on first and second planes of the first epitaxial region at first and second growth rates, respectively, the first plane being different from the second plane;
- simultaneously etching the epitaxially grown material of the buffer region on the first and second planes of the first epitaxial region at first and second etch rates, respectively; and
- providing process conditions for the epitaxial growth and etch of the material on the first and second planes such that the first growth rate is faster than the second growth rate and the first etch rate is slower than the second etch rate.

4. The method of claim 3, wherein providing process conditions for the epitaxial growth and etch of the material on the first and second planes comprises:
- providing an etching gas; and
- providing a precursor of the material of the buffer region, wherein a ratio of a flow rate of the etching gas to a flow rate of the precursor is in a range from 0.5 to 1.

5. The method of claim 1, wherein growing the buffer region on the first epitaxial region comprises:
- forming a first portion of the buffer region on a (100) crystal plane of the first epitaxial region; and
- forming a second portion of the buffer region on a (111) crystal plane of the first epitaxial region,
- wherein a ratio of a growth rate of the first portion to a growth rate of the second portion is in a range from 5 to 10.

6. The method of claim 1, wherein etching back the portion of the second epitaxial region comprises:
- providing a reaction mixture comprising $H_2$, $N_2$, HCl, and $GeH_4$.

7. The method of claim 1, wherein growing the buffer region on the first epitaxial region comprises:
- epitaxially growing a Ge-comprising material on the first epitaxial region, the Ge-comprising material having an amount of Ge in a range from 10 atomic percent to 15 atomic percent; and
- in-situ doping the buffer region to have a p-type dopant concentration less than about $2 \times 10^{21}$ atoms/cm$^3$.

8. The method of claim 1, wherein growing the buffer region on the first epitaxial region comprises epitaxially growing a material of the buffer region in contact with the first epitaxial region.

9. The method of claim 1, wherein growing the first epitaxial region of the first fin structure comprises epitaxially growing the first epitaxial region over the first fin structure, wherein the first epitaxial region comprises a (100) crystal plane or a (111) crystal plane.

10. The method of claim 1, wherein forming the second epitaxial region of the second fin structure comprises epitaxially growing the second epitaxial region over the second fin structure, wherein the second epitaxial region comprises a (111) crystal plane.

11. A method of forming a fin structure of a semiconductor device, the method comprising:
- forming an insulating region on a substrate;
- epitaxially growing a first region on the substrate;
- epitaxially growing a second region on the substrate, the second region being laterally displaced from the first region by the insulating region;
- epitaxially growing a merged region with a top surface substantially parallel to the substrate, wherein the merge region physically connects to the first and second regions;
- epitaxially growing a buffer region on the merged region to prevent etch back of a top surface of the merged region during a subsequent etch process; and
- epitaxially growing a capping region on the buffer region.

12. The method of claim 11, wherein epitaxially growing the buffer region comprises:
- epitaxially growing a material of the buffer region on first and second planes of the first region at first and second growth rates, respectively, the first plane being different from the second plane;
- etching the epitaxially grown material of the buffer region on the first and second planes of the first region at first and second etch rates, respectively; and
- providing process conditions for the epitaxial growth and etch of the material on the first and second planes such that the first growth rate is faster than the second growth rate and the first etch rate is slower than the second etch rate.

13. The method of claim 11, wherein epitaxially growing the merged region on the first and second regions comprises:
- epitaxially growing a Ge-comprising material on the first and second regions, the Ge-comprising material having an amount of Ge in a range from 35 atomic percent to 70 atomic percent; and
- in-situ doping the merged region to have a p-type dopant concentration in a range from $1 \times 10^{20}$ atoms/cm$^3$ to $2 \times 10^{21}$ atoms/cm$^3$.

14. The method of claim 11, wherein epitaxially growing the capping region on the buffer region comprises:
- epitaxially growing a Ge-comprising material on the buffer region, the Ge-comprising material having an amount of Ge less than about 25 atomic percent; and
- in-situ doping the first region to have a p-type dopant concentration in a range from $1 \times 10^{20}$ atoms/cm$^3$ to $3 \times 10^{21}$ atoms/cm$^3$.

15. The method of claim 11, further comprising epitaxially growing a third region and a fourth region on the substrate, wherein:
- each of the first region, the second region, the third region, and the fourth region is laterally displaced from each other by the insulating region; and
- a lateral separation between the third region and the fourth region is greater than an other lateral separation between the first region and the second region.

16. A method for forming a semiconductor device having a first fin structure and a second fin structure on a substrate, the method comprising:
- forming an insulating region on the substrate;
- epitaxially growing a first region on the substrate, wherein the first region comprises a first sub-region and a second sub-region laterally separated by a first spacing;
- epitaxially growing a second region on the substrate, wherein the second region comprises a third sub-region and a fourth sub-region laterally separated by a second spacing;
- epitaxially growing a first epi-layer from the first sub-region, a second epi-layer from the second sub-region, a third epi-layer from the third sub-region, and a fourth epi-layer from the fourth sub-region, wherein the second spacing is greater than the first spacing such that the first epi-layer and the second epi-layer forms a merged region over the first spacing and the third epi-layer and the fourth epi-layer are laterally separated by a gap;

forming a buffer region over the merged region;

etching back a portion of the third epi-layer and a portion of the fourth epi-layer, wherein the buffer region prevents etch back of a top surface of the merged region during the etching; and forming a capping region on the buffer region, the etched third epi-layer, and the etched fourth epi-layer.

17. The method of claim 16, wherein forming the buffer region comprises:

simultaneously epitaxially growing a material of the buffer region on a first plane and a second plane of the first epi-layer and the second epi-layer at first and second growth rates, respectively, the first plane being different from the second plane; and providing process conditions for the epitaxial growth of the material on the first plane and the second plane such that the first growth rate is higher than the second growth rate.

18. The method of claim 17, wherein the first plane comprises a (100) crystal plane, and the second plane comprises a (111) crystal plane.

19. The method of claim 16, wherein forming the buffer region comprises:

simultaneously epitaxially growing a material of the buffer region on a first plane and a second plane of the first epi-layer and the second epi-layer at first and second growth rates, respectively, the first plane being different from the second plane;

simultaneously etching the epitaxial grown material of the buffer region on the first plane and the second plane of the first epi-layer and the second epi-layer at first and second etch rates, respectively; and providing process conditions for the epitaxial growth and etch of the material on the first plane and the second plane such that the first growth rate is higher than the second growth rate and the first etch rate is lower than the second etch rate.

20. The method of claim 19, wherein providing process conditions for the epitaxial growth and etch of the material on the first plane and the second plane comprises;

providing an etching gas; and providing a precursor of the material of the buffer region, wherein a ratio of a flow rate of the etching gas to a flow rate of the precursor is in a range from 0.5 to 1.

* * * * *